US006982175B2

(12) United States Patent
Johnson et al.

(10) Patent No.: US 6,982,175 B2
(45) Date of Patent: Jan. 3, 2006

(54) END POINT DETECTION IN TIME DIVISION MULTIPLEXED ETCH PROCESSES

(75) Inventors: David Johnson, Palm Harbor, FL (US); Russell Westerman, Largo, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 7 days.

(21) Appl. No.: 10/770,839

(22) Filed: Feb. 2, 2004

(65) Prior Publication Data

US 2004/0175913 A1   Sep. 9, 2004

Related U.S. Application Data

(60) Provisional application No. 60/447,594, filed on Feb. 14, 2003.

(51) Int. Cl.
*H01L 21/302* (2006.01)

(52) U.S. Cl. ............................ 438/9; 438/16; 438/695; 438/714; 216/60; 216/67

(58) Field of Classification Search ................. 216/60, 216/67; 438/7, 8, 9, 16, 695, 714
See application file for complete search history.

(56) References Cited

U.S. PATENT DOCUMENTS

| 4,491,499 | A | 1/1985 | Jerde et al. |
| 4,985,114 | A | 1/1991 | Okudaira et al. |
| 5,308,414 | A | 5/1994 | O'Neill et al. |
| 5,450,205 | A | 9/1995 | Sawin et al. |
| 5,501,893 | A | 3/1996 | Laermer et al. |
| 5,658,423 | A | 8/1997 | Angell et al. |
| 6,021,215 | A | 2/2000 | Kornblit et al. |
| 6,104,487 | A | 8/2000 | Buck et al. |
| 6,200,822 | B1 | 3/2001 | Becker et al. |
| 6,455,437 | B1 | 9/2002 | Davidow et al. |

FOREIGN PATENT DOCUMENTS

JP     2001-044171     *  2/2001

* cited by examiner

*Primary Examiner*—George A. Goudreau
(74) *Attorney, Agent, or Firm*—Holland & Knight LLP

(57) ABSTRACT

An improved method for determining endpoint of a time division multiplexed process by monitoring an identified region of a spectral emission of the process at a characteristic process frequency. The region is identified based upon the expected emission spectra of materials used during the time division multiplexed process. The characteristic process frequency is determined based upon the duration of the steps in the time division multiplexed process. Changes in the magnitude of the monitored spectra indicate the endpoint of processes in the time division multiplexed process and transitions between layers of materials.

20 Claims, 16 Drawing Sheets

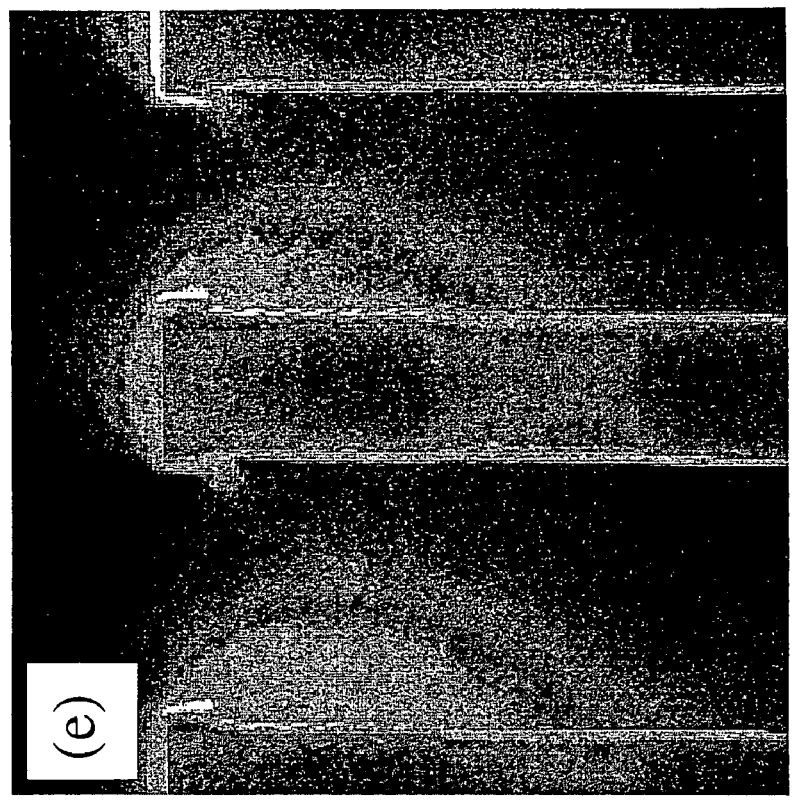
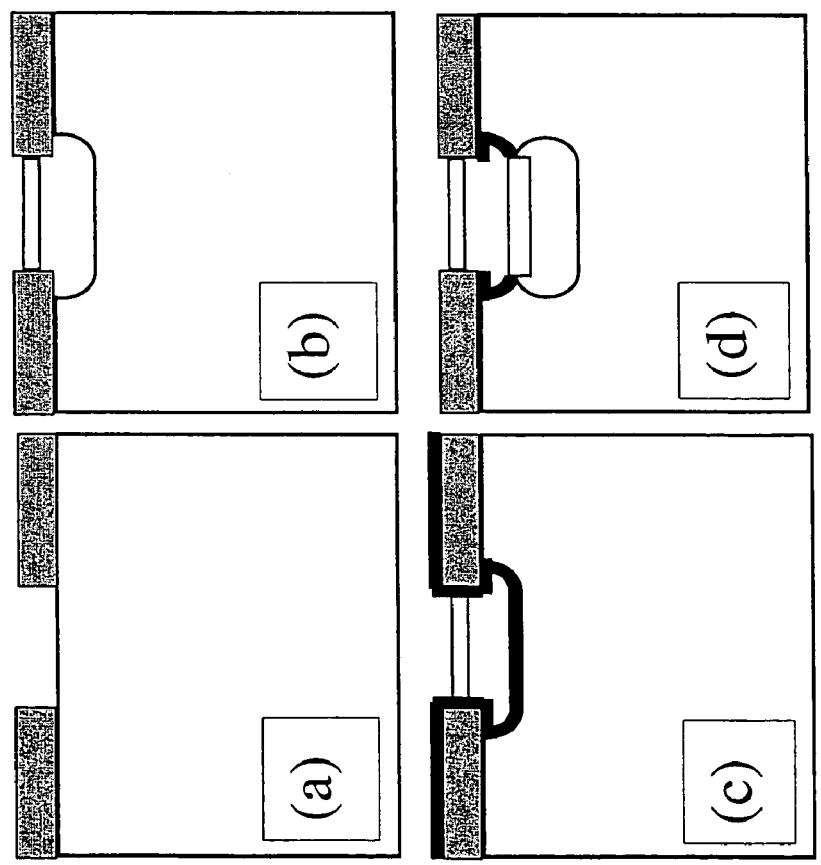
Fig. 2

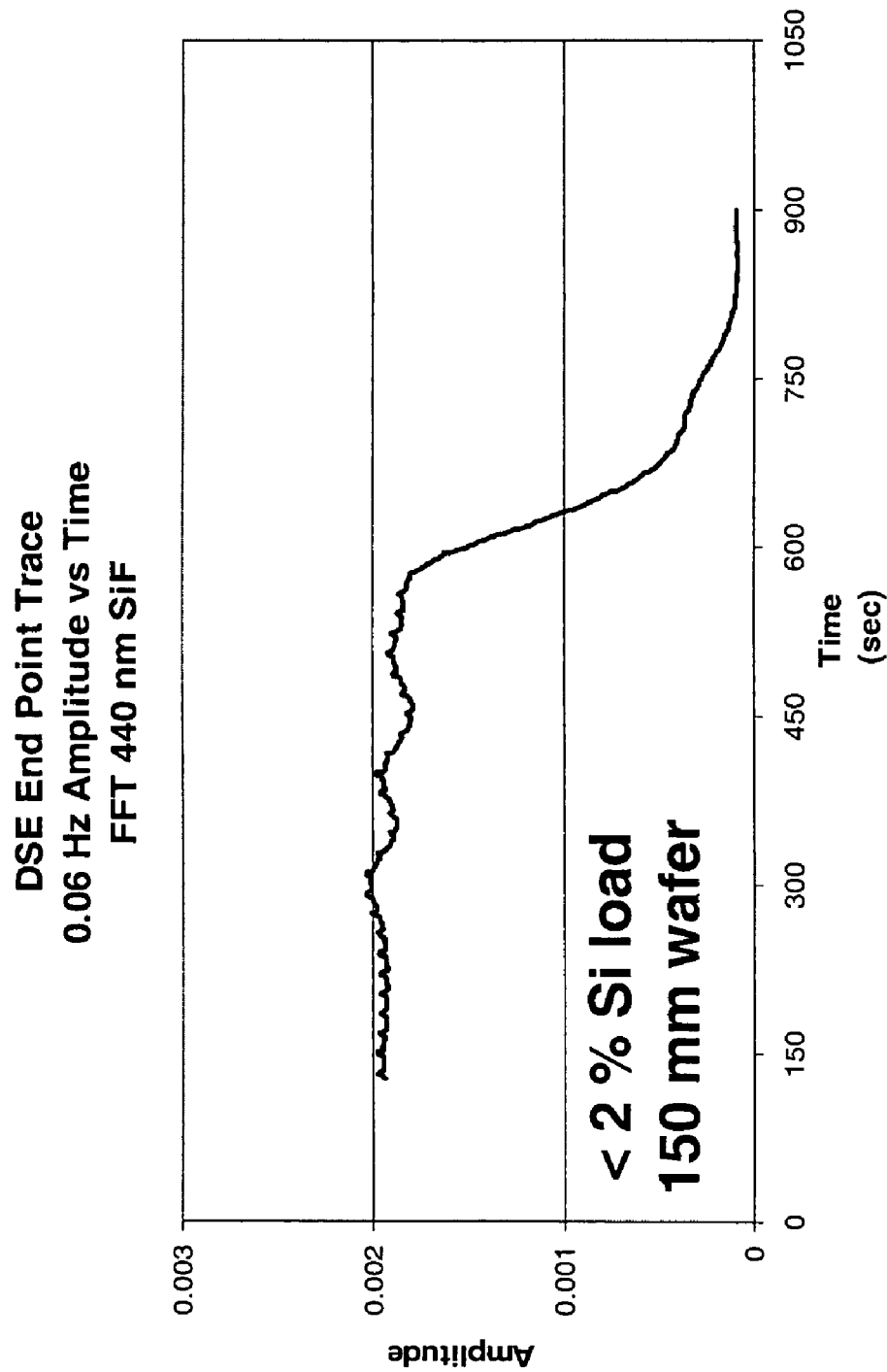

END POINT DETECTION IN TIME DIVISION MULTIPLEXED ETCH PROCESSES

CROSS REFERENCES TO RELATED APPLICATIONS

This application claims priority from and is related to commonly owned U.S. Provisional Patent Application Ser. No. 60/447,594, filed Feb. 14, 2003, entitled: End Point Detection in Time Division Multiplexed Etch Processes, this Provisional Patent Application incorporated by reference herein.

FIELD OF THE INVENTION

The present invention generally relates to the field of semiconductor manufacturing. More particularly, the present invention is directed toward an improved method of detecting the end point of a time division multiplexed etching and deposition process.

BACKGROUND OF THE INVENTION

During the fabrication of many MEMs devices it is required to etch a layer of material to completion stopping on the layer below (e.g., Silicon on Insulator (SOI)—clearing a silicon (Si) layer stopping on an underlying silicon dioxide layer). Allowing the etch process to proceed beyond the time when the first layer has been removed can result in reduced thickness of the underlying stop layer, or feature profile degradation (known in the art as "notching" for SOI applications).

One method commonly used to detect plasma process termination times is optical emission spectrometry (OES). OES analyzes the light emitted from a plasma source to draw inferences about the chemical and physical state of the plasma process. In semiconductor processing this technique is commonly used to detect material interfaces during plasma etch processes. Selwyn's monograph *Optical Diagnostic Techniques for Plasma Processing* provides an excellent review on the principles and application of plasma emission spectrometry.

The OES technique involves monitoring the radiation emitted by the plasma, usually in the UV/VIS (200 nm–1100 nm) portion of the spectrum. FIG. 1 shows a schematic of a typical OES configuration. The composition of the plasma, and in particular the presence of reactive etch species or etch by-products, is determined by the spectra (i.e., intensity vs. wavelength) of the emitted radiation. During the course of an etch process, and especially at a material transition, the composition of the plasma changes, resulting in a change in the emission spectrum. By continuously monitoring the plasma emission, it is possible for an OES endpoint system to detect a change in the emission spectrum and use it to determine when the film has completely cleared. In practice, most of the information relating to endpoint is usually contained within a few wavelengths that correspond to reactants consumed or etch by-products generated during the etch.

A common method to develop an OES endpoint strategy is to collect a number of spectra of the plasma emission (emission intensity v. wavelength) during both pre- and post-endpoint conditions. These spectra can be used to identify candidate wavelength regions for the process. Candidate regions contain the wavelengths that show a significant intensity change as the process reaches the transition between the two materials of interest. Endpoint wavelength candidate regions can be determined using a number of methods. Spectral regions for endpoint detection can be chosen through statistical methods such as factor analysis or principal component analysis (see U.S. Pat. No. 5,658,423 Angell et al). Another strategy to determine endpoint candidates is through the construction of a difference plot between pre-(main etch) and post-endpoint (over etch) spectra. Once candidate regions have been selected, assignments of likely chemical species may be made for the candidate regions (i.e., reactant species from dissociated gas precursors or etch products). A number of references including *Tables of Spectral Lines* by Zaidel et al. and *The Identification of Molecular Spectra* by Pearse et al. in conjunction with knowledge of the process chemistry can be used to assign likely species identities for the candidate lines. An example of likely endpoint candidates for a silicon (Si) etch process in a sulfur hexafluoride ($SF_6$) plasma would be fluorine lines (F) at 687 nm and 703 nm as well as the silicon fluoride (SiF) emission band at 440 nm. Once these regions have been determined, subsequent parts can be processed using the same OES strategy.

While these OES approaches work well for single step processes or processes with a limited number of discrete etch steps (such as an etch initiation followed by a main etch) it is difficult to apply OES to plasma processes with rapid and periodic plasma perturbations. Examples of such processes are the time division multiplexed processes disclosed by Okudaira et al. in U.S. Pat. No. 4,985,114 and Laermer et al. in U.S. Pat. No. 5,501,893. These authors disclose a TDM process for etching high aspect ratio features into Si using an alternating series of etch and deposition steps.

FIGS. 2(*a–e*) show a schematic representation of the TDM etch process. The TDM etch process is typically carried out in a reactor configured with a high-density plasma source, typically an Inductively Coupled Plasma (ICP), in conjunction with a radio frequency (RF) biased substrate electrode. The most common process gases used in the TDM etch process for Si are sulfur hexafluoride ($SF_6$) and octofluorocyclobutane ($C_4F_8$). $SF_6$ is typically used as the etch gas and $C_4F_8$ as the deposition gas. During the etch step, $SF_6$ facilitates spontaneous and isotropic etching of silicon (FIG. 2(*b*)); in the deposition step, $C_4F_8$ facilitates protective polymer deposition onto the sidewalls as well as the bottom of etched structures (FIG. 2(*c*)). The TDM process cyclically alternates between etch and deposition process steps enabling high aspect ratio structures to be defined into a masked silicon substrate. Upon energetic and directional ion bombardment, which is present in etch steps, the polymer film coated in the bottom of etched structures from the previous deposition step will be removed to expose the surface of the silicon for further etching (FIG. 2(*d*)). The polymer film on the sidewall will remain because it is not subjected to direct ion bombardment, inhibiting lateral etching. Using the TDM approach allows high aspect ratio features to be defined into silicon substrates at high Si etch rates. FIG. 2(*e*) shows a scanning electron microscope (SEM) image of a cross section of a silicon structure etched using a TDM process.

The plasma emission spectra of etch and deposition steps are dramatically different due to the different plasma conditions that exist in the deposition and etch steps (process gas types, pressures, RF powers, etc.—see FIG. 3). Applying conventional OES methods to a TDM silicon etch process results in an end point trace that is periodic (FIG. 4). It is expected that the majority of the etch endpoint information is contained within the etch segments of the process.

Becker et al. (U.S. Pat. No. 6,200,822) show a method to extract endpoint information from the plasma emission of a TDM process. Becker examines the emission intensity of at least one species (typically fluorine or SiF for a Si etch) in the plasma only during the etch step through the use of an externally supplied trigger (typically the transition from one process step to the next). By using a trigger in conjunction with a sample-and-hold circuit, the emission intensity observed in subsequent etch steps can be stitched together to obtain an emission signal that is not periodic in nature. The value of the emission intensity for the species in the etch step is held at the last known value during the ensuing deposition step. In this manner the periodic emission signal is converted into a curve similar to a step function that can be used for process endpoint determination. The limitations of this approach are the need for an externally supplied trigger in addition to the need for a user input delay between the trigger and acquiring the emission data during etch steps.

In an effort to increase the OES method sensitivity Jerde et al. (U.S. Pat. No. 4,491,499) disclose measuring a narrow band of the emission spectrum while simultaneously measuring the intensity of a wider background band centered about the narrow band. In this manner the background signal can be subtracted from the endpoint signal resulting in a more accurate value of the narrow band signal.

A number of groups have looked at frequency components of plasma emission spectra. Buck et al. (U.S. Pat. No. 6,104,487) describes using digital signal processing techniques such as Fast Fourier Transforms (FFT) to extract frequency components from the plasma emission spectrum. Buck teaches that these components give information about changes in the plasma condition and can be used to detect transitions in the substrate material allowing etch endpoint detection. Buck teaches monitoring infrasonic frequencies down to 10 Hz. Buck considers that the monitored frequencies will change for different processes; however, he only considers steady state (single step) processes, and using FFT optical emission in conjunction with time division multiplexed (TDM) processes that are periodic and repeating is not taught.

Kornblit et al. (U.S. Pat. No. 6,021,215) also describes the use of Fourier transforms in conjunction with optical emission spectroscopy. Kornblit teaches monitoring all frequency components simultaneously, but does not teach the use of optical emission FFT for a TDM process.

Davidow et al. (U.S. Pat. No. 6,455,437) also describes generating frequency components from plasma emissions and monitoring the amplitude of that signal over time. While Davidow contemplates multi-step processes for etching multilayer stacks, the use of optical emission in conjunction with FFT is not taught for TDM processes. Furthermore, Davidow characterizes the plasma process by noting which frequencies are emerging during the course of the process—not examining the magnitude of the characteristic frequencies imposed on the process by the cyclical nature of the TDM process.

O'Neill et al. (U.S. Pat. No. 5,308,414) describes an optical emission system using signal demodulation. O'Neill monitors both a narrow spectral region associated with an etch product along with a wider spectral band to be used as a background correction. O'Neill also discloses frequency demodulation of the signals through the use of a lock-in amplifier. The lock-in amplifier requires an external synchronization signal. O'Neill does not consider multi-step or TDM processes.

Sawin et al. (U.S. Pat. No. 5,450,205) describes a system using optical emission interferometry (OEI) in conjunction with FFT to determine process endpoint. In contrast to optical emission spectrometry (OES) which analyzes the plasma emission, emission interferometry images plasma emission reflected from the wafer surface to determine on-wafer film thickness. Unlike OES, OEI techniques require the imaging detector have a clear line of sight to the wafer surface. The OEI technique is unsuitable for TDM processes that contain repetitive deposition and etch steps due to the cyclical addition and removal of a passivation film as the etch proceeds.

Accordingly, there is a need for an endpoint point strategy for TDM plasma processes that does not require an external trigger to synchronize the plasma emission data collection with the process steps.

SUMMARY OF THE INVENTION

A preferred embodiment of the present invention is directed toward a method for establishing an endpoint during an anisotropic plasma etching process of a substrate to provide laterally defined recess structures therein through an etching mask by employing a plasma. In accordance with the method, a surface of the substrate is plasma etched in an etching step by contact with a reactive etching gas to remove material from the surface of the substrate and provide exposed surfaces. The surface of the substrate is passivated in a deposition step such that both horizontal and vertical surfaces that were exposed in a preceding etching step are covered by a passivation layer. The etching step and the passivating step are alternatingly repeated. Plasma emission is monitored at a specific wavelength or wavelength region(s) and at a characteristic frequency which is imposed by the alternating nature of the TDM process. The specific wavelength region(s) is preferably determined based upon an emission spectra of a material used during the process. In an alternative embodiment, the plasma emission is monitored at two or more wavelength regions and the ratio (or other mathematical operation) of the magnitude of the first wavelength region and the second or more wavelength regions is calculated. In such an embodiment, one or more wavelength regions may be selected to represent background signal. The imposed characteristic process frequency is determined based upon the sum of the duration of the etching step and the duration of the passivating step. The characteristic frequency of the process is less than 5 Hz for a typical TDM process. The process is discontinued at a time which is dependent upon the monitoring step.

Another embodiment of the invention is directed toward a method of detecting an endpoint for a TDM process. In accordance with the method, a first wavelength region of a plasma emission spectrum of the process is identified. A characteristic process frequency, imposed by the TDM process is also identified and the first wavelength region of the plasma emission spectrum is monitored at this characteristic process frequency. The characteristic process frequency is based upon a determined duration of the sum of the etching and deposition steps present in the process. The magnitude of the identified wavelength region is monitored during the process to determine the endpoint of the process. A second, or multiple, wavelength region(s) of the emission spectrum is also monitored. The endpoint of the TDM process is determined based upon a mathematical combination of the wavelength regions (for example, addition, subtraction or division). A Fast Fourier Transform or a corresponding digital signal processing technique is used to resolve the frequency components of the plasma emission spectrum. The endpoint of the process is typically based upon a material transition occurring during the etching process. In such a case, the identified wavelength region of the spectrum is based upon a known spectral characteristic of a material used during the TDM process.

Yet another embodiment of the present invention is directed toward a method of detecting the transition between different materials in a TDM process. In accordance with this method, a characteristic frequency of the process is identified. The characteristic frequency of the process is based upon the sum of the duration of an etching step and a deposition step performed as part of the TDM process. A region of a spectral emission of the process is monitored at the characteristic frequency to determine a transition between different materials. The transition occurs at an endpoint of a series of etching steps performed as part of the TDM process. The region of the spectral emission monitored at the characteristic frequency depends upon a known spectral characteristic of a material used during the TDM process.

BRIEF DESCRIPTION OF THE DRAWINGS

FIGS. 2(a–e) show a representation of a TDM etch process;

FIG. 16 is a plot of the frequency of the 0.6 Hz component shown in FIG. 15.

DETAILED DESCRIPTION OF THE INVENTION

A preferred embodiment of the present invention is directed toward a means of detecting the transition between different materials in a time division multiplexed (TDM) process by analyzing at least one wavelength component of the collected electromagnetic emission at a frequency corresponding to the frequency (v) of the TDM process.

Due to the periodic and repeating nature of a TDM process, by design, the process has a number of characteristic frequencies associated with it. As an example, consider a two step TDM silicon etch process consisting of a 4 (four) second etch step and a 6 (six) second deposition step that are subsequently repeated a number of times (see Table I below).

|  |  | Deposition | Etch |
|---|---|---|---|
| $SF_6$ Flow | sccm | 0.5 | 100 |
| $C_4F_8$ Flow | sccm | 70 | 0.5 |
| Ar Flow | sccm | 40 | 40 |
| Pressure | mtorr | 22 | 23 |
| RF Bias Power | w | 1 | 12 |
| ICP Power | w | 1000 | 1000 |
| Step Time | sec | 4 | 6 |

Note, the deposition and etch steps differ in chemistry, RF bias power and pressure resulting in significantly different emission spectra. Due to the repetitive nature of the TDM process and the duration of the deposition and etch steps, the example process in Table I has a cycle repetition time of 10 seconds and thus an expected characteristic frequency of 0.1 Hz. The sampling rate of the spectra must be fast enough to accurately capture the periodic nature of the plasma emission without aliasing. Consequently, the sampling frequency must be higher than the Nyquist frequency, and preferably 10 times the expected characteristic frequency.

Figure 1:
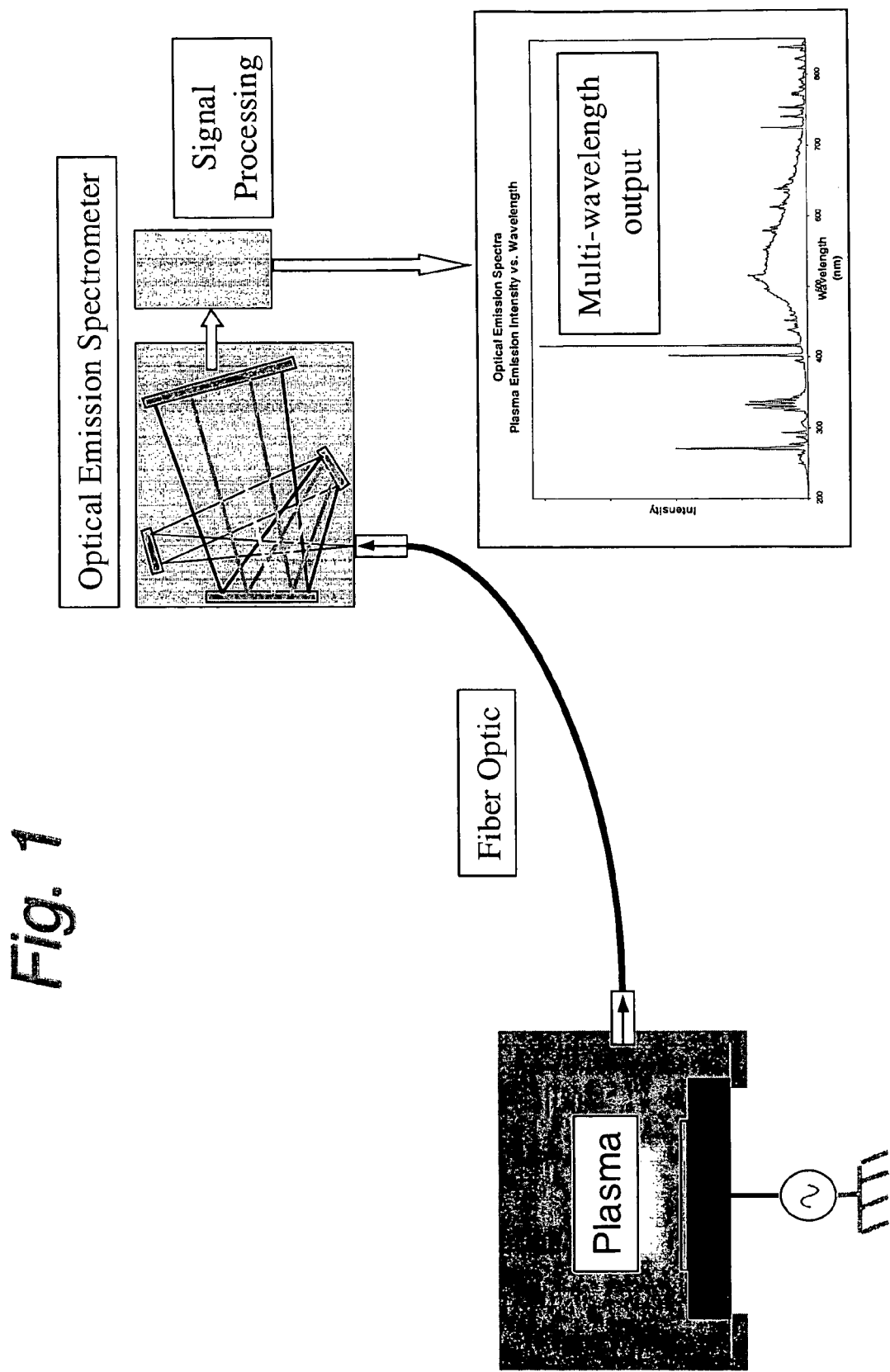
FIG. 1 shows a schematic of a typical OES configuration.
Figure 3:
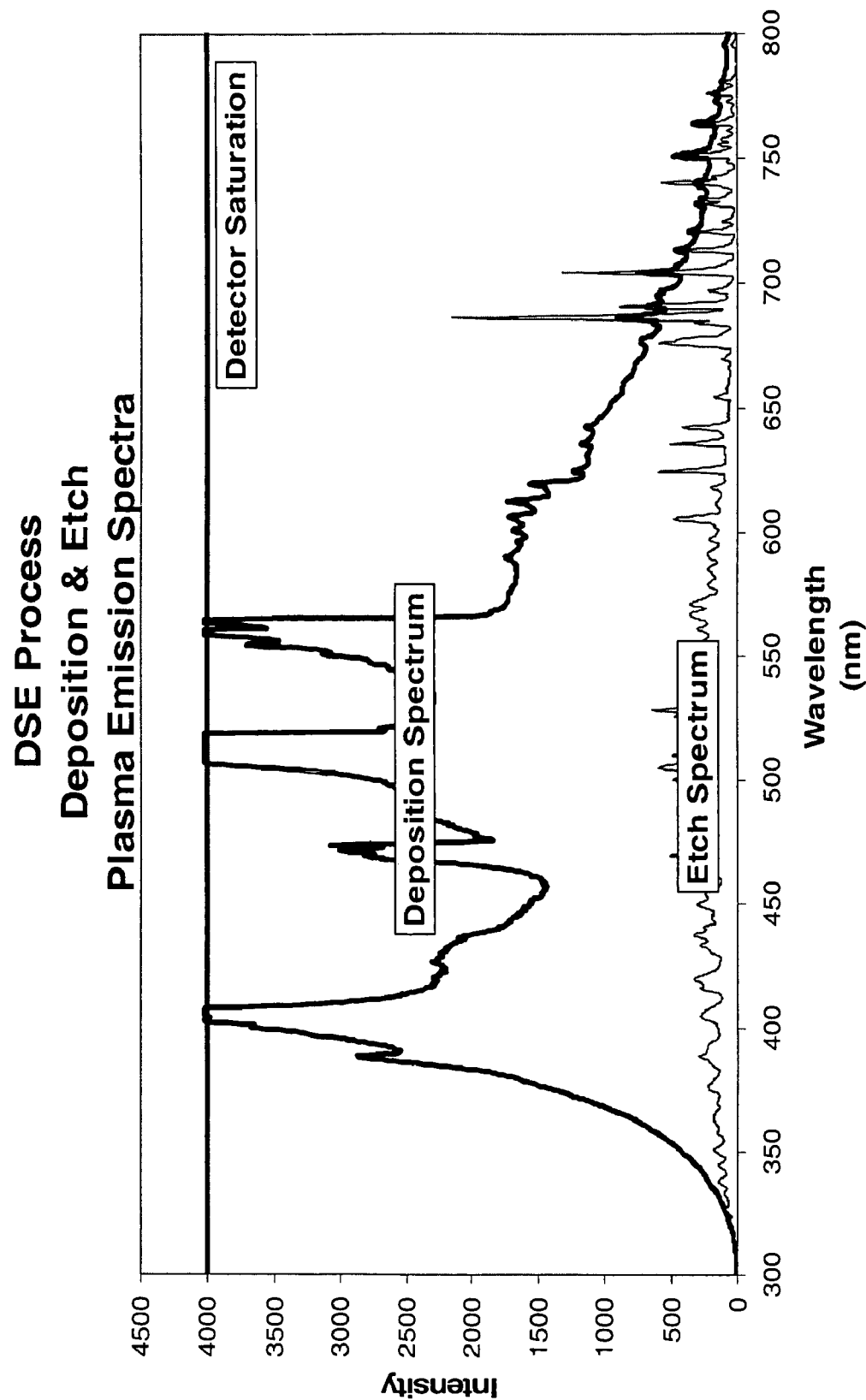
FIG. 3 is graph of deposition and etch plasma emission spectra for an exemplary TDM process.
Figure 4:
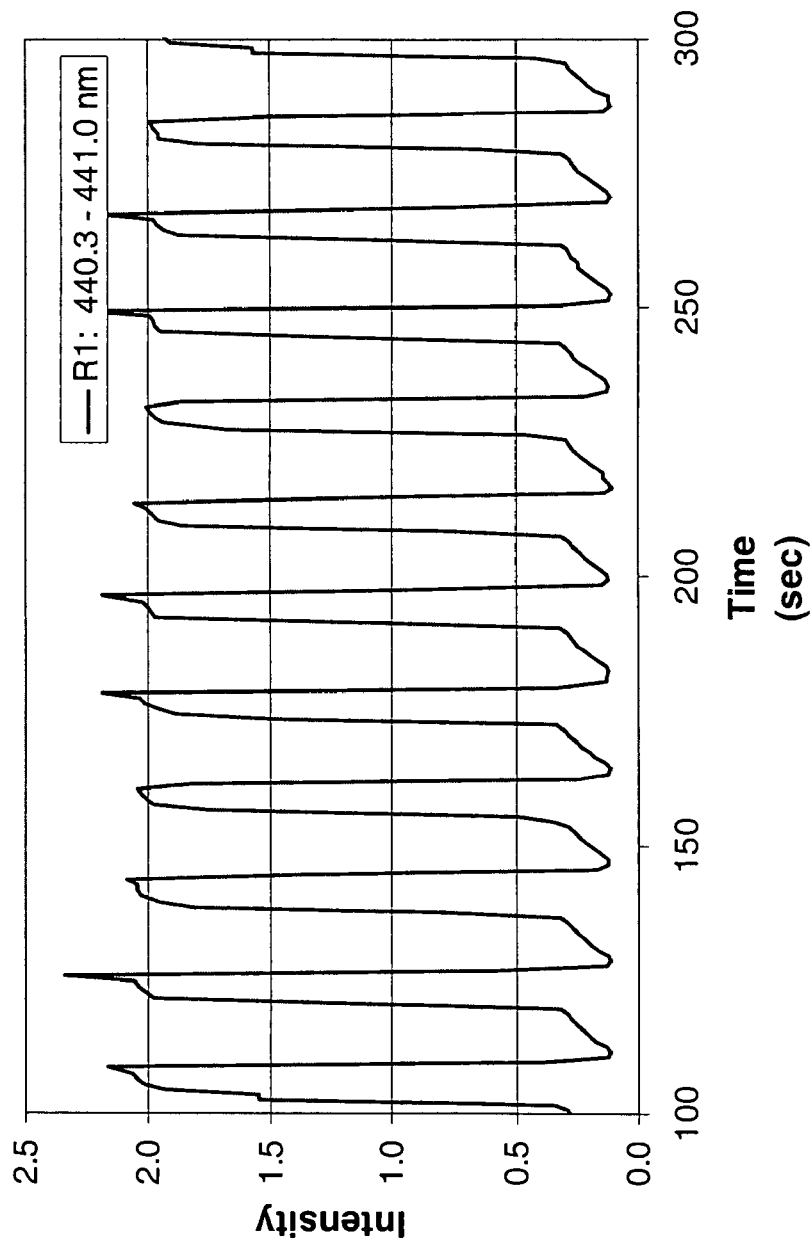
FIG. 4 is an endpoint trace for an exemplary TDM process.
Figure 5:
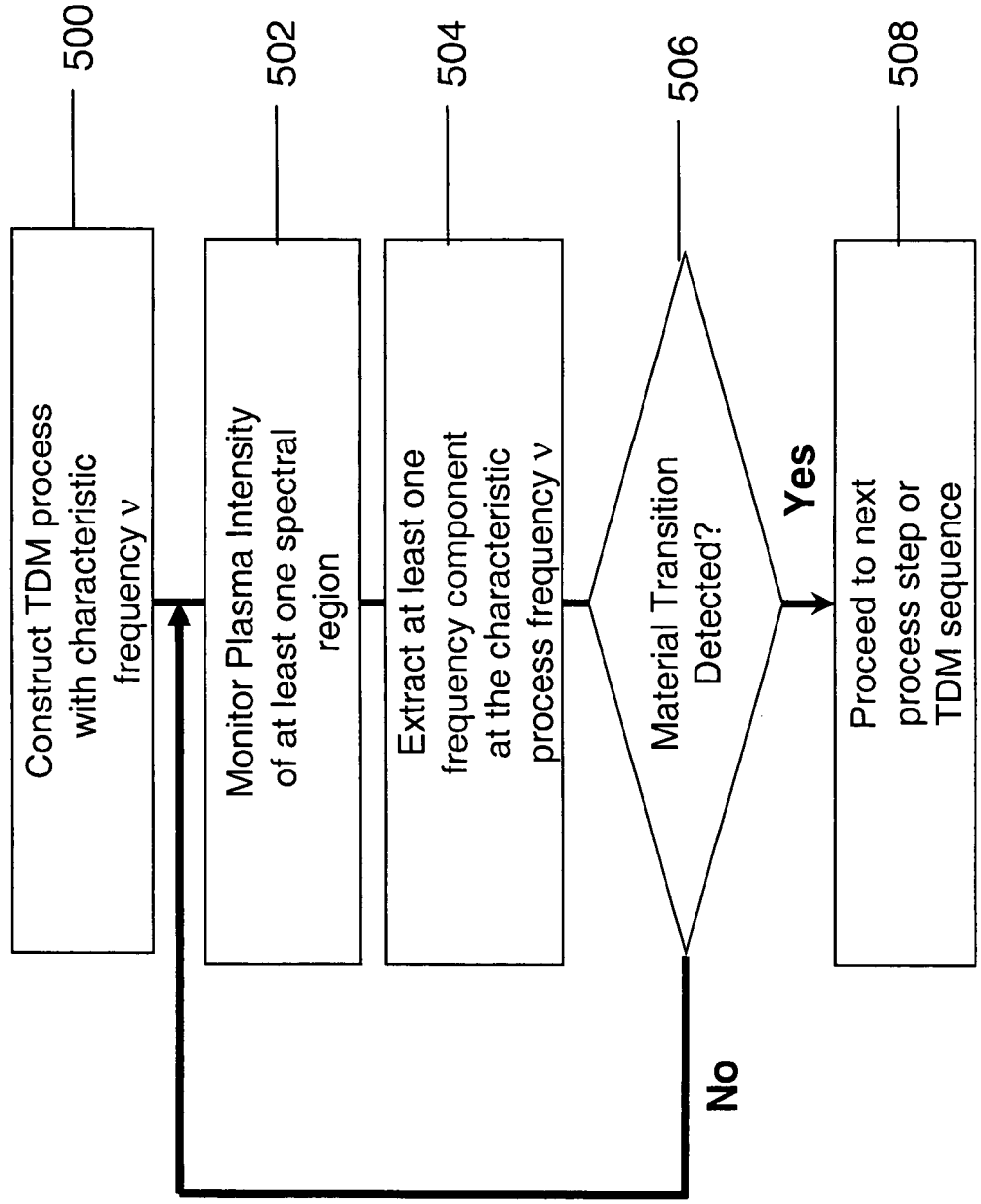
FIG. 5 shows an overview of an embodiment of the present invention directed toward an improved OES technique for TDM processes.

The schematic in FIG. 5 shows an overview of an embodiment of the present invention directed toward an improved OES technique for TDM processes. A TDM process is constructed with at least one characteristic frequency that depends upon the duration of the steps of the process in step 500. The characteristic frequency of TDM processes is typically less than 5 Hz. At least one wavelength region of the plasma emission spectrum (typically within 200–1100 nm for plasma emission) of the TDM process is identified for process endpoint detection. The spectral region(s) is monitored during the course of the TDM etch process in step 502. Since the emission signal for a TDM process is periodic and repeating, the emission signal can be resolved into frequency components. At least one frequency component is at the characteristic process frequency, and is extracted in step 504. One method of extracting the frequency components is through the use of Fast Fourier Transforms (FFT), though other digital signal processing (DSP) techniques may also be used. If a material transition is detected in step 506, the method proceeds to step 508 wherein the method proceeds to the next process step or TDM sequence. If a material transition is not detected in step 506, the method returns to step 502 wherein the plasma intensity of at least one spectral region is monitored until a material transition is detected. In contrast to previous teachings using OES with FFT, monitoring the magnitude of the emission signal at a characteristic TDM process frequency (typically, but not always, less than 5 Hz) over time, provides a reliable method for detecting transitions between layers during a TDM etch process.

An alternate embodiment of the invention uses two or more wavelength components derived from the emission data to improve the sensitivity of the endpoint detection. At least one of the wavelength components is a characteristic wavelength of the TDM process. Other wavelength components may represent background signal. The mathematical combination of two or more components (such as addition, subtraction or division) provides greater sensitivity in certain applications.

Note, the approach of the present invention is not limited to a two step cyclical process. In practice, it is common to further subdivide the etch portion of the process into a number of sub-steps. The further partitioning of the TDM process into sub-steps merely results in additional, process imposed, characteristic frequencies.

It is also important to note that the process parameters within each repetitive process loop of an etching step and a deposition step are not required to remain constant cycle to cycle. For example, it is common during the TDM etching of silicon to gradually change the efficiency of the deposition or etching step over the course of the process to maintain profile control (known in the art as process morphing). In a morphed process, small parameter changes are made in the process parameters between some number of etch or deposition steps. These include, but are not limited to, gas flow rate, RF bias power, process pressure, inductive source power (ICP), etc. These changes can also include changing the duration time of the process steps within a TDM cycle. If the cycle time changes during the course of the process are larger than the frequency resolution of the transform, the algorithm is modified to monitor the sum of adjacent frequency components to capture the imposed process frequency shift.

While a preferred embodiment of the present invention is demonstrated for deep Si etching using an $SF_6/C_4F_8$ based process, the preferred embodiments of the present invention are valid independent of chemistry provided that a time division multiplex process is utilized. The preferred methods are also particularly useful for detecting material transitions in other materials such as, dielectric materials and metals, where a repetitive time division multiplex process is used.

To demonstrate the utility of an embodiment of the present invention, a TDM recipe was used to etch a silicon-on-insulator (SOI) wafer. The recipe is listed in Table 2 below. The example below applies an embodiment of the invention to a 3-step TDM Si etch process.

|  |  | Deposition | Etch A | Etch B |
| --- | --- | --- | --- | --- |
| $SF_6$ Flow | sccm | 1 | 50 | 100 |
| $C_4F_8$ Flow | sccm | 70 | 1 | 1 |
| Ar Flow | sccm | 40 | 40 | 40 |
| Pressure | mtorr | 22 | 23 | 23 |
| RF Bias Power | w | 1 | 12 | 12 |
| ICP Power | w | 1500 | 1500 | 1500 |
| Step Time | sec | 6 | 3 | 7 |

The experiments were performed on a commercially available Unaxis Shuttlelock series Deep Silicon Etch (DSE) tool. Emission spectra were collected at a frequency of 1 Hz using a commercially available Unaxis Spectraworks emission spectrometer.

Figure 6:
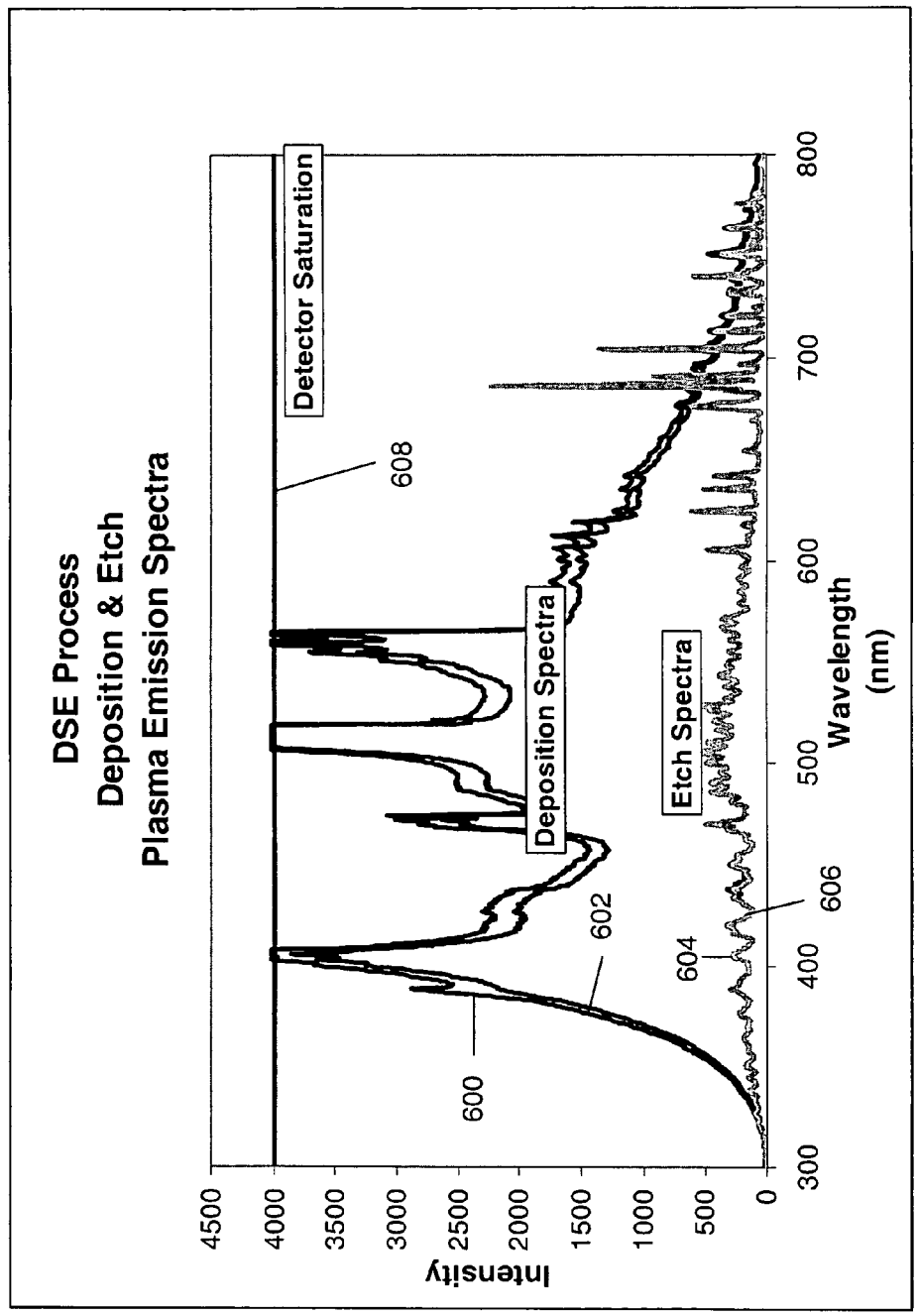
FIG. 6 shows the intensity versus wavelength plots for a test wafer used in validating an embodiment of the present invention.
Figure 7:
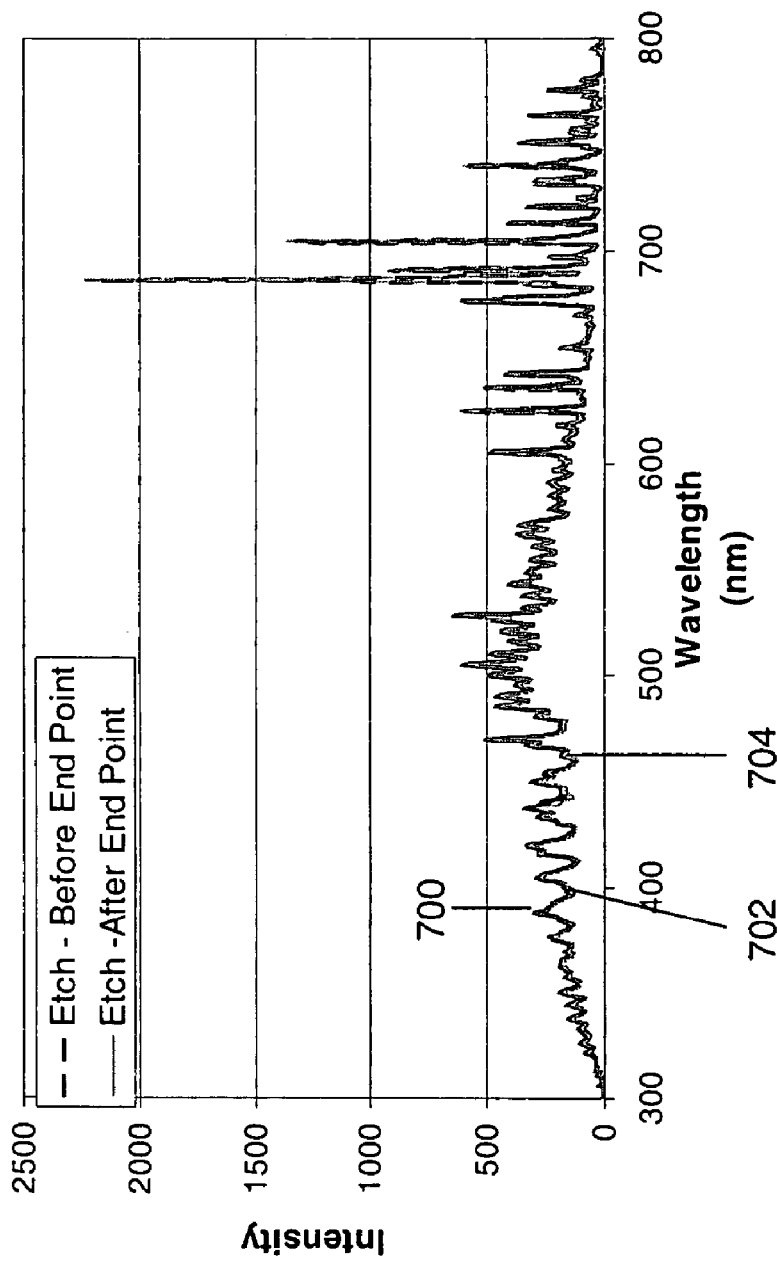
FIG. 7 shows a graph of the etch spectra before and after the endpoint of a TDM process.

In order to determine the wavelength region(s) of interest, a test wafer was etched and plasma emission spectra in both the deposition step and etch step were analyzed prior to and after the silicon layer had been cleared (process endpoint). FIG. 6 shows the intensity versus wavelength plots for the plasma emission spectra of the test wafer. The deposition spectra before the endpoint of the process 600, deposition spectra after the end point of the process 602, etch spectra before the endpoint of the process 604 and etch spectra after the endpoint of the process 606 are shown in FIG. 6. The detector saturation 608 is represented by the line at the top of the graph. Since little etching is expected during the deposition phases of the process, FIG. 7 focuses on the emission spectra from the etch step before 700 and after 702 the silicon had cleared. Note, the slight difference 704 in etch spectra near 450 nm. In order to determine endpoint candidates, a point-by-point difference spectrum was constructed.

Figure 8:
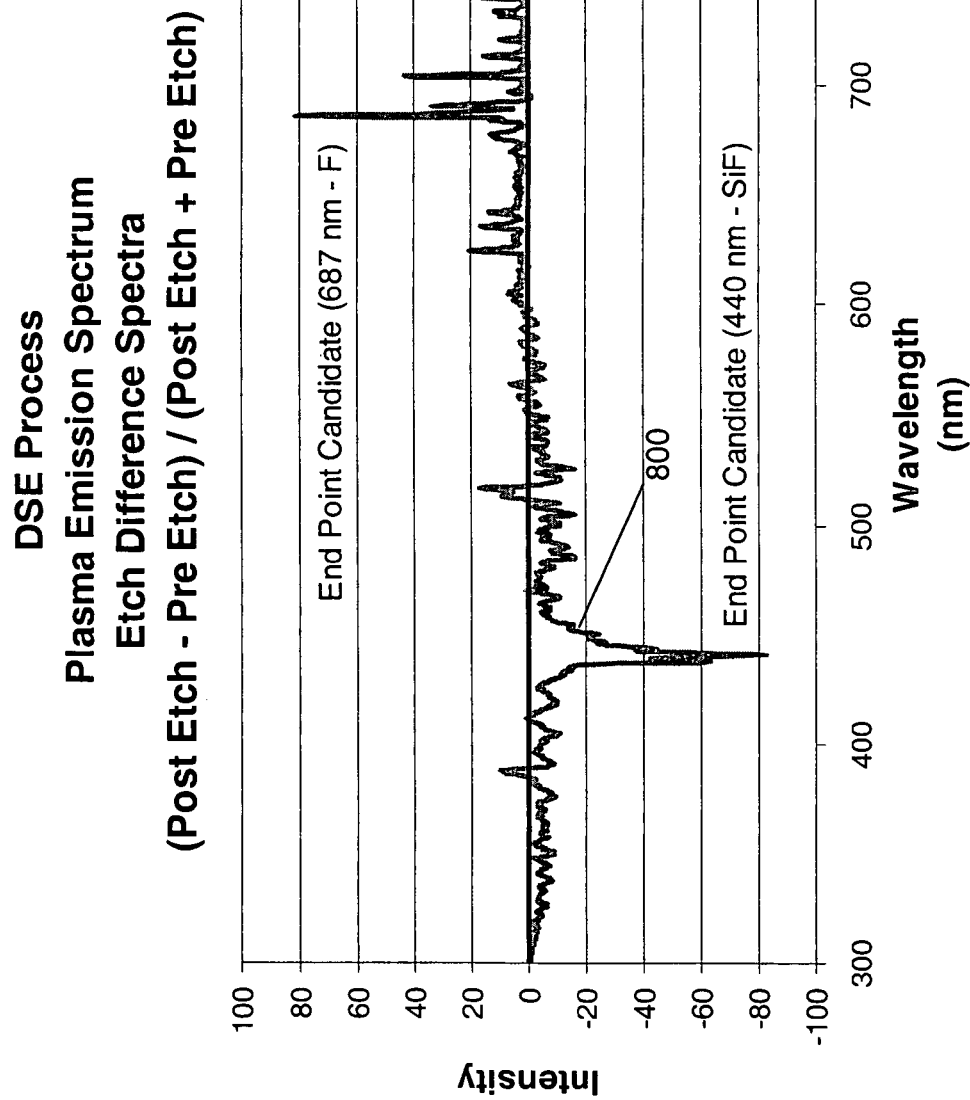
FIG. 8 shows a graph of a normalized difference spectrum for the etch spectra of FIG. 7.

The resultant spectrum 800 is shown in FIG. 8. Candidates for endpoint detection occur at 440 nm and 686 nm. The 440 nm peak is assignable to a silicon fluoride (SiF) emission (etch product—decreases as the Si is cleared) while the 686 nm peak is assignable to fluorine (F) emission (reactant—increases as the Si is cleared).

Figure 9:
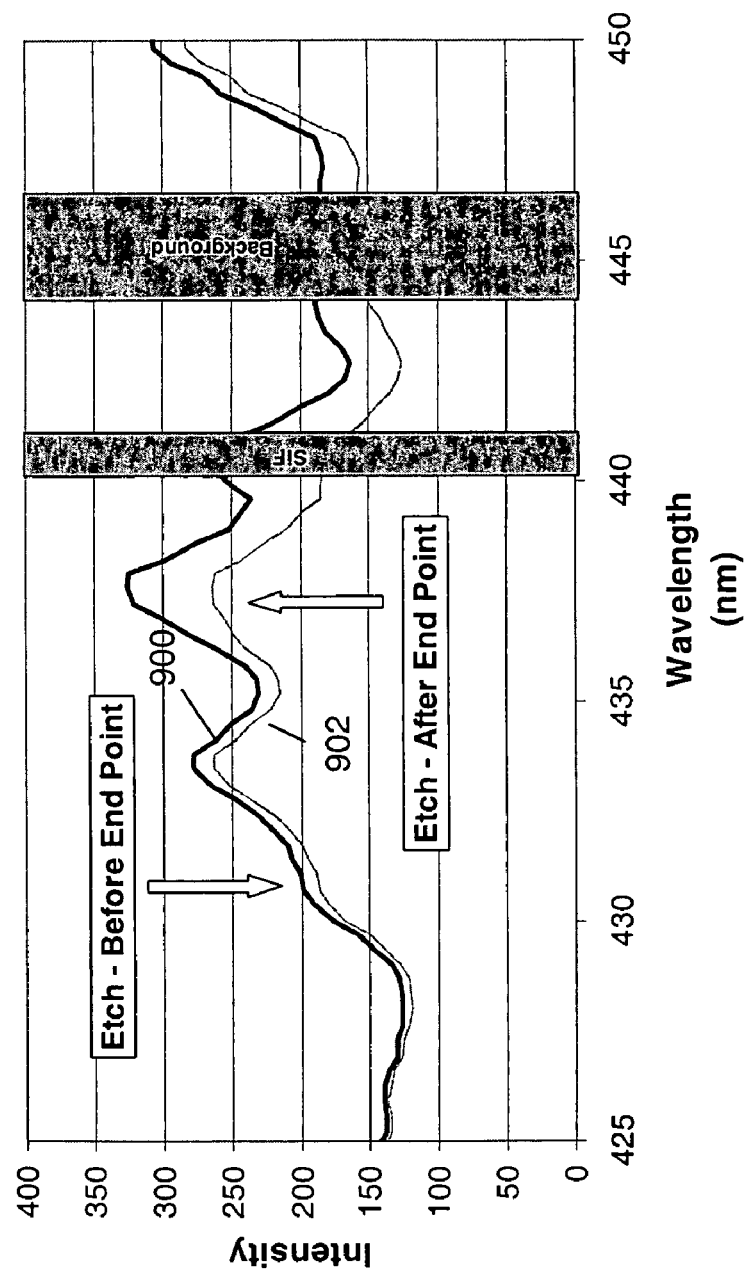
FIG. 9 shows a magnified view of the pre and post-endpoint etch emission spectra.

An endpoint strategy was constructed based on the 440 emission peak. FIG. 9 shows a magnified view of the pre 900 and post-end point 902 etch emission spectra in order to more closely examine the 440 nm peak. In order to reduce correlated noise, two spectral regions 904 and 906 were monitored—a narrow 440 nm peak (SiF emission) and a broader spectral region centered around 445 nm for background correction.

Figure 10:
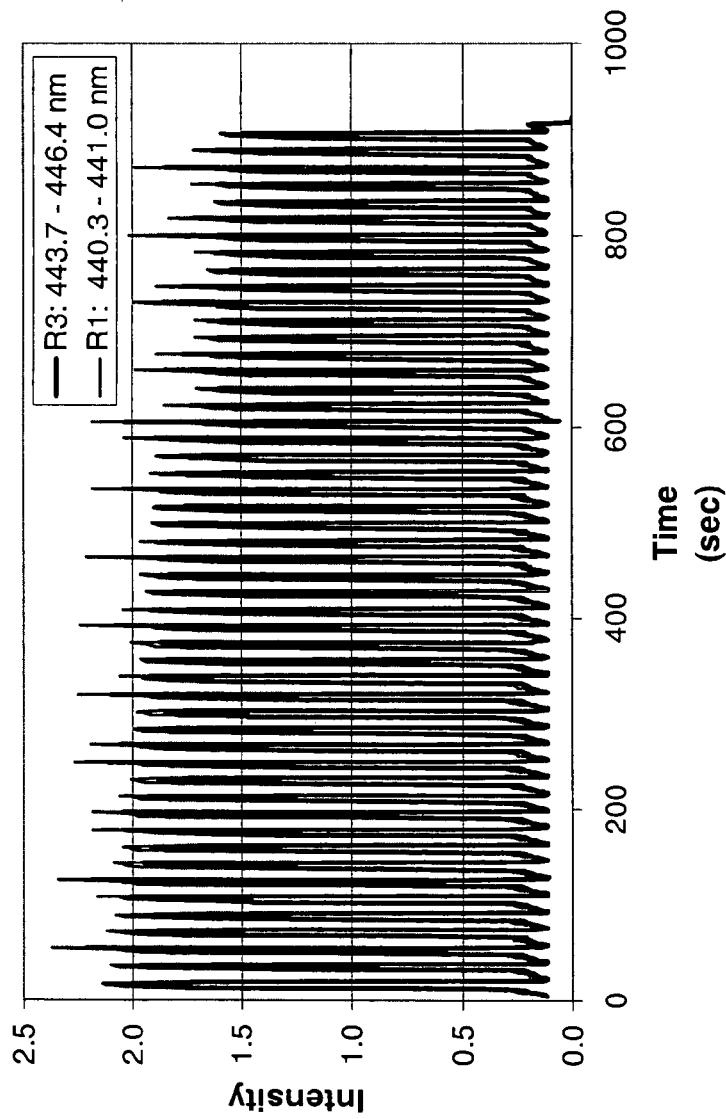
FIG. 10 shows a plot of the values of the spectral intensity within the two spectral regions identified in FIG. 9 versus time.
Figure 11:
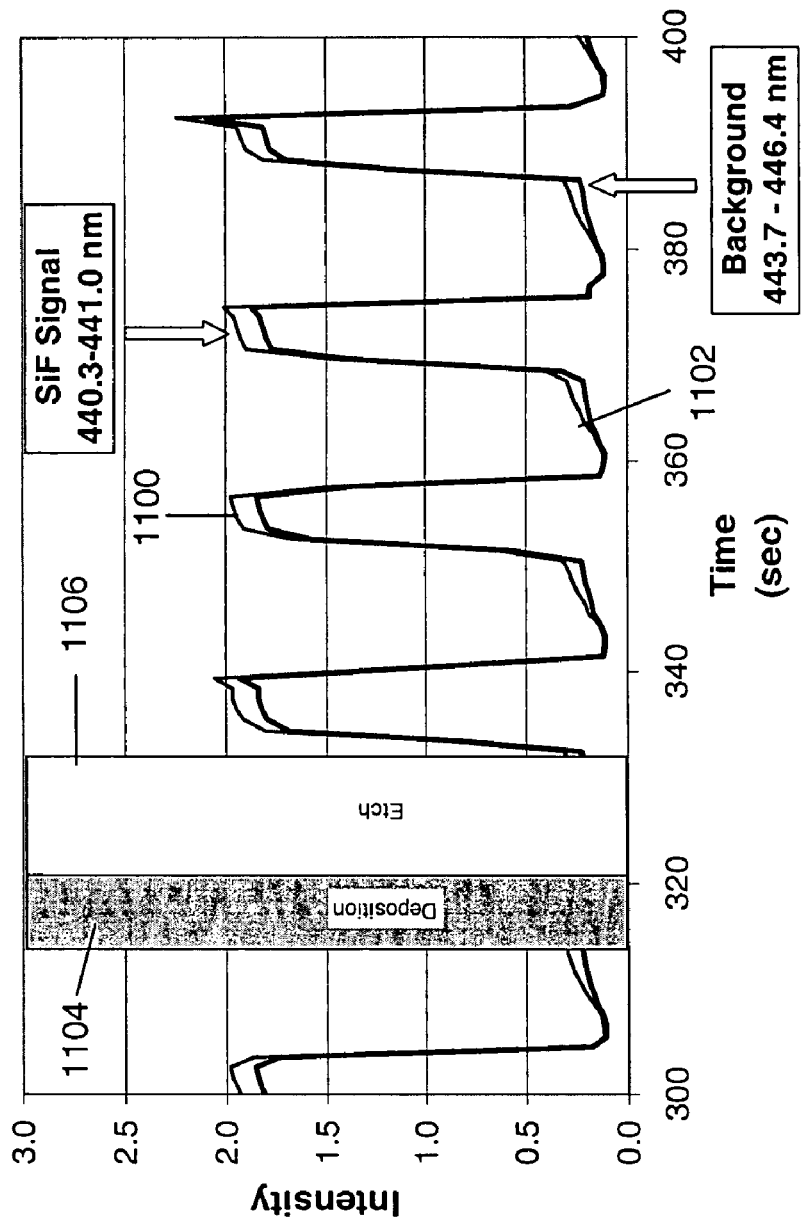
FIG. 11 shows a magnified view of FIG. 10 over the range of 300 to 400 seconds of total etch time.
Figure 12:
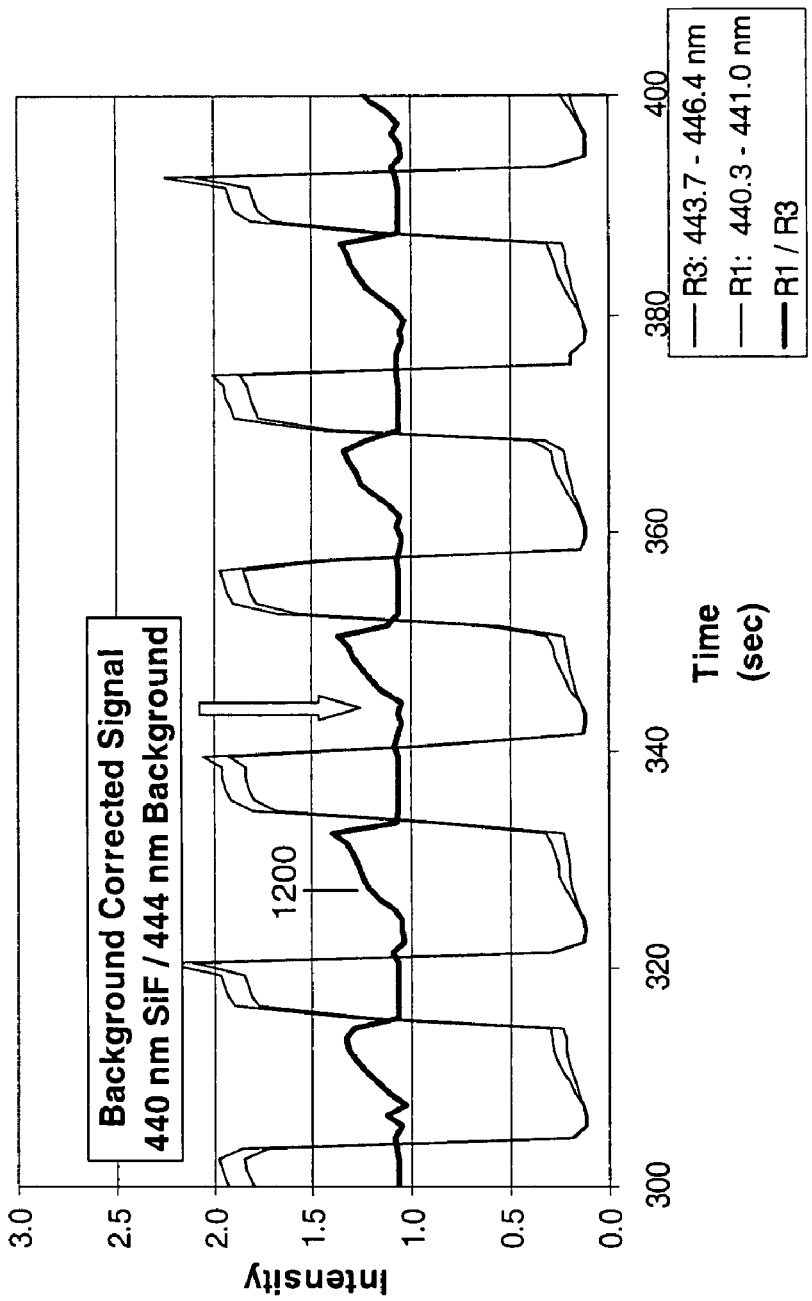
FIG. 12 is a graph of the ratio of the 440 nm signal and the 443 nm signal shown in FIG. 11.

FIG. 10 plots the values within the two regions versus time. While there is a slight decrease in the peak-to-peak values of the oscillating signal as the etch proceeds, it is difficult to determine a process endpoint. FIG. 11 shows a magnified view of FIG. 10 over the range of 300 to 400 seconds of total etch time. Note, the signal (440 nm) 1100 and background (445 nm) 1102 regions track each other well during the higher intensity deposition step 1104, but diverge near the end of the etch step 1106. Constructing the ratio of the 440 nm signal and the 445 nm background results in FIG. 12 where the large emission variations between the etch and deposition steps have been eliminated, and the resulting signal is more representative of the degree of etching which takes place. Note, the periodic and repeating nature of the ratio signal 1200 as shown in FIG. 12.

Figure 13:
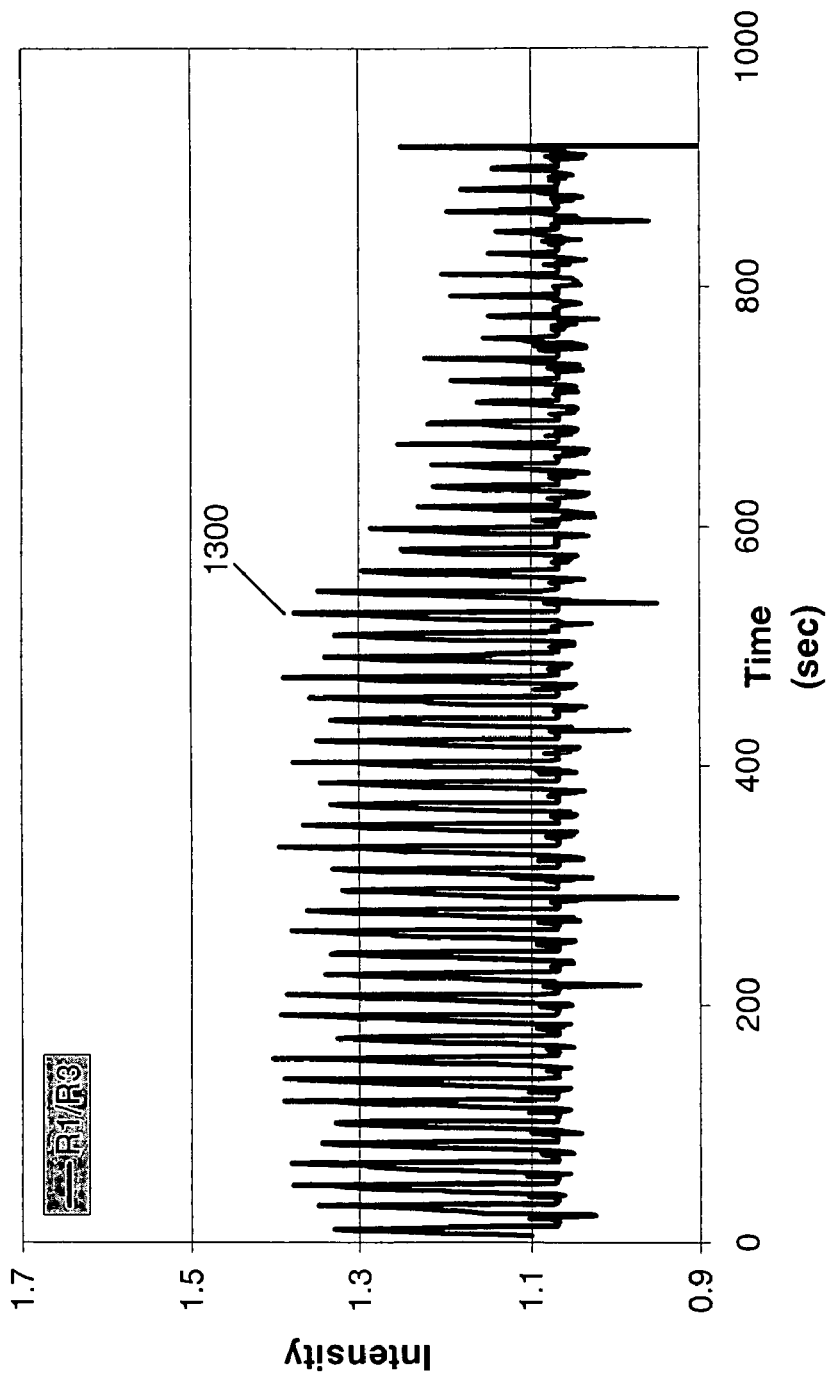
FIG. 13 is a graph of the ratio signal shown in FIG. 12 over the course of the etch.

FIG. 13 shows the ratio signal (440 nm SiF/445 nm background) 1300 over the course of the etch. Note the decrease in successive peak heights near 600 seconds as shown in FIG. 13. The characteristic frequency of the trace shown in FIG. 13 is 0.06 Hz. This is the recipe-imposed frequency, corresponding to 16 seconds, which is the sum of the times of the individual process steps of the cyclical process in Table 2.

Figure 14:
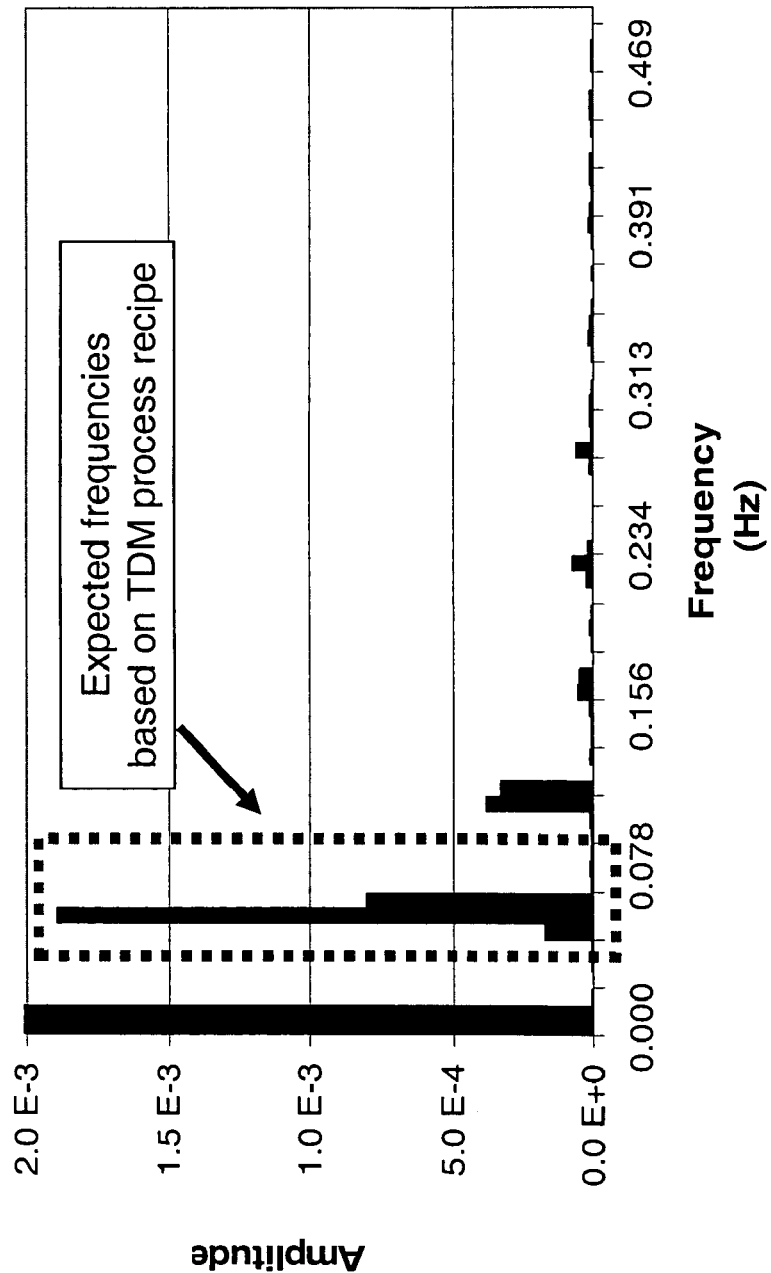
FIG. 14 is a graph of the signal in FIG. 13 in the frequency domain.
Figure 15:
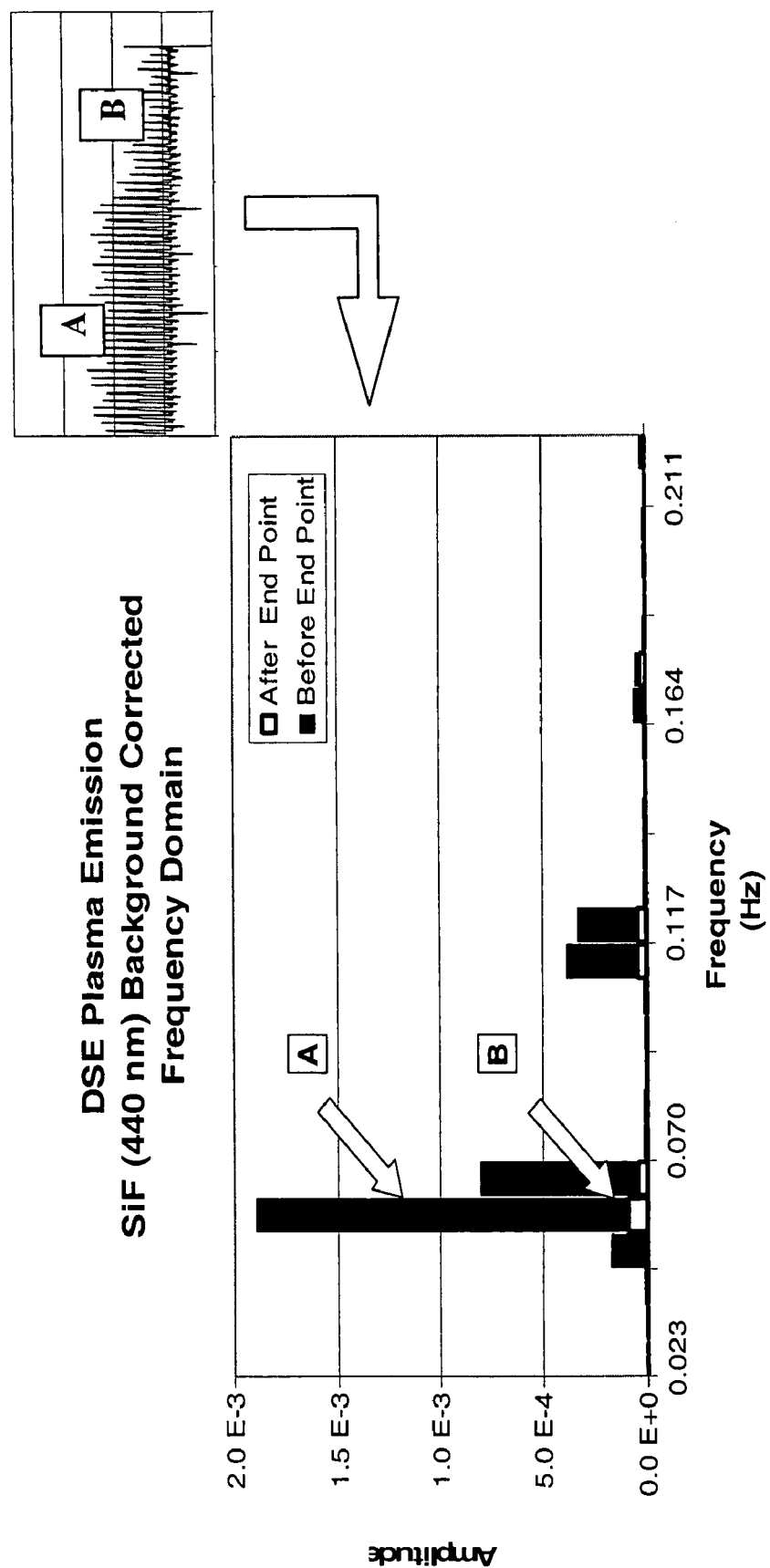
FIG. 15 is a plot of the amplitudes of the frequency domain signal of FIG. 14 before and after the endpoint of the process.

Converting the signal in FIG. 13 from the time domain to the frequency domain using a Fast Fourier Transform (FFT) calculation results in the power spectrum shown in FIG. 14. The FFT calculation was based on a 128 element array that was appended to form an evolving window of the OES signal as the process proceeded. The frequencies highlighted by the dotted box are those expected due to the periodic and repeating nature of the TDM process recipe. FIG. 15 shows the amplitudes of the FFT power spectra at two points in the process. Note, the 0.06 Hz component has a large amplitude prior to the endpoint and decreases nearly to zero after the Si layer has been cleared. Plotting the magnitude of the 0.06 Hz component over time results in the process endpoint trace shown in FIG. 16. Determining the actual endpoint time from this curve can be done by a variety of means, including, but not limited to, simple threshold detection or differential detection. Such techniques are well known to those skilled in the art.

The above discussed embodiments allow the endpoint of a TDM process to be accurately determined by monitoring the emission spectra of the deposition and etching steps at a characteristic frequency of the process. The ability to accurately determine an endpoint of such a process minimizes or eliminates the possibility of over etching the desired feature and, thus, reducing the thickness of the underlying stop layer. In addition, feature profile degradation known in the art as "notching" is also minimized. Furthermore, the present invention is well suited for use in any plasma processes with rapid and periodic plasma perturbations. Thus, the present invention is a substantial improvement upon the prior art.

The present disclosure includes the portions that are contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for establishing endpoint in a plasma etching process, the method comprising the steps of:
    placing a substrate in a vacuum chamber;
    etching a material from the substrate by means of a plasma;
    depositing a passivation layer on the substrate by means of a plasma;
    performing a process loop of repeating the etching step and the deposition step;
    monitoring a variation in a plasma emission intensity at a characteristic frequency corresponding to the repetitive rate of the etching step or the deposition step of the process loop step;
    discontinuing the process loop step based on said monitoring step; and
    removing the substrate from the vacuum chamber.

2. The method of claim 1 wherein the characteristic frequency is determined based on a sum of the duration of the etching step and the deposition step of the process loop step.

3. The method of claim 1 wherein said process imposed frequency is less than about 5 Hz.

4. The method of claim 1 wherein said process loop further comprises multiple etch steps per process loop.

5. The method of claim 1 wherein said process loop further comprises multiple deposition steps per process loop.

6. The method of claim 1 wherein the step of monitoring further comprises monitoring plasma emission intensity at a plurality of wavelength regions.

7. The method of claim 6 wherein the step of monitoring said plurality of wavelength regions further comprises performing mathematical operations to extract a plurality of frequency components to acquire at least one characteristic frequency.

8. The method of claim 7 wherein the mathematical operations is a Fast Fourier Transform.

9. The method of claim 7 wherein the step of monitoring said plurality of wavelength regions further comprises performing mathematical operations to correct for a background plasma emission.

10. The method of claim 6 wherein said wavelength regions are chosen through mathematical analysis of the plasma emission spectrum.

11. The method of claim 10 wherein said mathematical analysis is principal component analysis.

12. A method for detecting the transition between different materials in a time division multiplexed process, the method comprising the steps of:
    placing a substrate in a vacuum chamber;
    performing the time division multiplexed process;
    monitoring a variation in a plasma emission intensity at a characteristic frequency corresponding to the frequency of the time division multiplexed process;
    discontinuing the time division multiplexed process based on said monitoring step; and
    removing the substrate from the vacuum chamber.

13. The method of claim 12 wherein the characteristic frequency is determined based on a sum of the duration of the steps of the time division multiplexed process.

14. The method of claim 12 wherein said characteristic frequency is less than about 5 Hz.

15. The method of claim 12 wherein the step of monitoring further comprises monitoring plasma emission intensity at a plurality of wavelength regions.

16. The method of claim 15 wherein the step of monitoring said plurality of wavelength regions further comprises performing mathematical operations to extract a plurality of frequency components to acquire at least one characteristic frequency.

17. The method of claim 16 wherein the mathematical operations is a Fast Fourier Transform.

18. The method of claim 16 wherein the step of monitoring said plurality of wavelength regions further comprises performing mathematical operations to correct for a background plasma emission.

19. The method of claim 15 wherein said wavelength regions are chosen through mathematical analysis of the plasma emission spectrum.

20. The method of claim 19 wherein said mathematical analysis is principal component analysis.

* * * * *

UNITED STATES PATENT AND TRADEMARK OFFICE
CERTIFICATE OF CORRECTION

PATENT NO. : 6,982,175 B2
DATED : January 3, 2006
INVENTOR(S) : David Johnson and Russell Westerman It is certified that error appears in the above-identified patent and that said Letters Patent is hereby corrected as shown below:

Column 9,
Lines 41-42, should read:
-- The method of claim 1 wherein said characteristic frequency is less than about 5 Hz. --.

Signed and Sealed this

Twenty-eighth Day of March, 2006

JON W. DUDAS
*Director of the United States Patent and Trademark Office*